US008831246B2

(12) United States Patent
Josefsson

(10) Patent No.: US 8,831,246 B2
(45) Date of Patent: Sep. 9, 2014

(54) MEMS MICROPHONE WITH PROGRAMMABLE SENSITIVITY

(75) Inventor: Olafur Mar Josefsson, Hafnarfjordur (IS)

(73) Assignee: Invensense, Inc., San Jose, CA (US)

( * ) Notice: Subject to any disclaimer, the term of this patent is extended or adjusted under 35 U.S.C. 154(b) by 343 days.

(21) Appl. No.: 12/962,136

(22) Filed: Dec. 7, 2010

(65) Prior Publication Data

US 2011/0142261 A1 Jun. 16, 2011

Related U.S. Application Data

(60) Provisional application No. 61/286,364, filed on Dec. 14, 2009.

(51) Int. Cl.

| | |
|---|---|
| ***H03G 3/00*** | (2006.01) |
| *H03G 11/00* | (2006.01) |
| *H04R 3/00* | (2006.01) |
| *H04R 19/00* | (2006.01) |
| *H04R 19/04* | (2006.01) |
| *H04R 19/01* | (2006.01) |

(52) U.S. Cl.

CPC ................ *H04R 3/00* (2013.01); *H04R 19/005* (2013.01); *H04R 2410/00* (2013.01); *H04R 19/04* (2013.01); *H04R 19/016* (2013.01)

USPC .............................. 381/107; 381/55; 381/113

(58) Field of Classification Search

USPC ......... 381/91, 92, 111–115, 122, 174, 26, 55, 381/57, 58, 95, 369, 379; 330/199, 297

See application file for complete search history.

(56) References Cited

U.S. PATENT DOCUMENTS

| | | | | |
|---|---|---|---|---|
| 6,795,374 | B2 | 9/2004 | Barnes et al. | 367/138 |
| 8,036,401 | B2 * | 10/2011 | Poulsen et al. | 381/113 |
| 8,041,056 | B2 * | 10/2011 | Kinoshita | 381/113 |
| 2010/0246859 | A1 * | 9/2010 | David et al. | 381/120 |
| 2011/0293115 | A1 * | 12/2011 | Henriksen | 381/111 |

* cited by examiner

*Primary Examiner* — Vivian Chin
*Assistant Examiner* — Ammar Hamid
(74) *Attorney, Agent, or Firm* — Maryam Imam; IPxLaw Group LLP

(57) ABSTRACT

A control circuit monitors a signal produced by a MEMS or other capacitor microphone. When a criterion is met, for example when the amplitude of the monitored signal exceeds a threshold or the monitored signal has been clipped or analysis of the monitored signal indicates clipping is imminent or likely, the control circuit automatically adjusts a bias voltage applied to the capacitor microphone, thereby adjusting sensitivity of the capacitor microphone.

50 Claims, 10 Drawing Sheets

MEMS MICROPHONE WITH PROGRAMMABLE SENSITIVITY

CROSS REFERENCE TO RELATED APPLICATIONS

This application claims the benefit of U.S. Provisional Patent Application No. 61/286,364, filed Dec. 14, 2009, titled "MEMS Microphone with Programmable Sensitivity," the entire contents of which are hereby incorporated by reference herein, for all purposes.

TECHNICAL FIELD

The present invention relates to MEMS (microelectromechanical system) systems, and more particularly to MEMS microphones with programmable sensitivity.

BACKGROUND ART

Microelectromechanical systems (MEMS) microphones are commonly used in mobile telephones and other consumer electronic devices, embedded systems and other devices. A MEMS microphone typically includes a conductive micromachined diaphragm that vibrates in response to an acoustic signal. The microphone also includes a conductive plate parallel to, and spaced apart from, the diaphragm with air or another dielectric between the conductive plate and the diaphragm. The diaphragm and the conductive plate collectively form a capacitor, and an electrical charge is placed on the capacitor, typically by an associated circuit. The capacitance of the capacitor varies rapidly as the distance between the diaphragm and the plate varies due to the vibration of the diaphragm. Typically, the charge on the capacitor remains essentially constant during these vibrations, so the voltage across the capacitor varies as the capacitance varies.

The varying voltage may be used to drive a circuit, such as an amplifier or an analog-to-digital converter, to which the MEMS microphone is connected. Such a circuit may be implemented as an application-specific integrated circuit (ASIC). A MEMS microphone connected to a circuit signal processing circuit is referred to herein as a "MEMS microphone system" or a "MEMS system." A MEMS microphone die and its corresponding ASIC are often housed in a common integrated circuit package to keep leads between the microphone and the ASIC as short as possible, such as to avoid parasitic capacitance caused by long leads.

When used in consumer electronics devices and other contexts, MEMS microphone systems may be subjected to widely varying amplitudes of acoustic signals, including background noise. For example, a mobile telephone used outdoors under windy conditions or in a subway station subjects the MEMS microphone to very loud acoustic signals. Even under quite ambient conditions, a user may hold a microphone too close to the user's mouth or speak in too loud a voice for the MEMS microphone system. Under these circumstances, the diaphragm may reach its absolute displacement limit, and the resulting signal may therefore be "clipped," causing undesirable distortion. Even if the diaphragm does not reach its absolute displacement limit, the ASIC or other processing circuitry may not be able to handle the peaks of the electrical signal from the MEMS microphone, i.e., the processing circuitry may have insufficient "headroom" for the signal from the MEMS microphone, and the signal may be clipped. Clipping can cause a loss of signal contents. For example, if a speech signal is clipped, the output signal waveform becomes flat and no longer varies with the human speech. Thus, during the clipped portion of each cycle, the signal conveys no intelligible content.

On the other hand, if a user speaks too softly, such as in the absence of background noise, the amplitude of the signal produced by the MEMS microphone may be very low, yielding a low signal-to-noise ratio (SNR) in the microphone signal or in a signal produced by some "downstream" circuit. Prior art audio systems sometimes include automatic gain control circuits that vary the gain of amplifiers that process signals produced by microphones. However, such gain adjustments can be abrupt and, thus, audibly displeasing. Furthermore, such gain adjustments do not change the headroom of the amplifiers. Thus, conventional MEMS and other capacitor microphone systems are susceptible to signal distortion and poor signal-to-noise characteristics.

SUMMARY OF THE INVENTION

An embodiment of the present invention provides a method for adjusting sensitivity of a capacitor microphone by dynamically changing a bias voltage applied to the capacitor microphone.

A control signal may be accepted, and the bias voltage may be dynamically changed based at least in part on the control signal. The control signal may be generated in response to an automatic circuit or in response to a user input.

Dynamically changing the bias voltage may involve automatically changing the bias voltage based at least in part on a signal derived from the capacitor microphone. For example, the bias voltage may be automatically changed so as to maintain magnitude of a signal from the capacitor microphone within a predetermined range, or so as to reduce clipping of the signal derived from the capacitor microphone, or so as to increase sensitivity of the capacitor microphone in response to the capacitor microphone receiving a low magnitude acoustic signal.

The bias voltage may be dynamically changed in response to the signal derived from the capacitor microphone meeting at least one predetermined criterion. At least one of the at least one predetermined criterion may involve magnitude of the signal derived from the capacitor microphone.

The bias voltage may be returned to a previous value, such as after a predetermined criterion is no longer met.

Automatically changing the bias voltage may involve maintaining the bias voltage substantially constant while magnitude of the signal derived from the capacitor microphone is less than a predetermined value, and automatically reducing the bias voltage by an amount that depends at least in part on an amount by which the magnitude of the signal derived from the capacitor microphone exceeds the predetermined value.

Automatically changing the bias voltage may involve maintaining the bias voltage substantially constant while magnitude of the signal derived from the capacitor microphone is within a predetermined range, and automatically reducing the bias voltage by an amount that depends at least in part on an amount by which the magnitude of the signal derived from the capacitor microphone differs from a value within the predetermined range.

Automatically changing the bias voltage may involve maintaining the bias voltage substantially constant while magnitude of the signal derived from the capacitor microphone is greater than a predetermined value, and automatically increasing the bias voltage by an amount that depends at least in part on an amount by which the magnitude of the signal derived from the capacitor microphone is less than the predetermined value.

Dynamically changing the bias voltage may involve maintaining the bias voltage substantially constant while magnitude of the signal derived from the capacitor microphone is between a first predetermined value and a second predetermined value; automatically increasing the bias voltage by an amount that depends at least in part on an amount by which the magnitude of the signal derived from the capacitor microphone is less than the first predetermined value; and automatically reducing the bias voltage by an amount that depends at least in part on an amount by which the magnitude of the signal derived from the capacitor microphone exceeds the second predetermined value.

The bias voltage may be reduced such that the bias voltage is changed by the amount over a time period of at least about one millisecond or at least about ten milliseconds.

A voltage change may occur at a first node of the capacitor microphone as a result of changing the bias voltage applied to a second node of the capacitor microphone. This voltage change may be compensated for, such as by providing a virtual ground coupled to the first node of the capacitor microphone.

The capacitor microphone may include a first node and a second node, and the bias voltage may be applied to the second node of the capacitor microphone. The impedance of a circuit coupled to the first node may be automatically changed in timed relation to automatically changing the bias voltage. The impedance of the circuit may then be automatically increased.

Automatically changing the impedance of the circuit may include automatically reducing the impedance of the circuit and then automatically increasing the impedance of the circuit, such that a voltage at the first node of the capacitor microphone, initially changed as a result of automatically changing the bias voltage applied to the second node of the capacitor microphone, returns to a value substantially equal to a voltage at the first node of the capacitor microphone before the bias voltage was changed.

Automatically changing the impedance of the circuit may include automatically reducing the impedance of the circuit and then automatically increasing the impedance of the circuit, such that the voltage at the first node of the capacitor microphone returns within about 50 milliseconds or within about one second to the value substantially equal to the voltage at the first node of the capacitor microphone before the bias voltage was changed.

In addition, an impedance of a circuit coupled to a first node of the capacitor microphone may be automatically changed, such that a voltage at the first node of the capacitor microphone, initially changed as a result of automatically changing the bias voltage applied to a second node of the capacitor microphone, returns to a value substantially equal to a voltage at the first node of the capacitor microphone before the bias voltage was changed.

The impedance of the circuit may be automatically reduced, and then automatically increased.

A substantially constant steady state voltage may be maintained at a first node of the capacitor microphone, despite automatically changing the bias voltage applied to a second node of the capacitor microphone, such as by coupling the first node to a virtual ground or coupling the first node to an input of an amplifier.

Another embodiment of the present invention provides a method for automatically adjusting sensitivity of a capacitor microphone, such as by automatically detecting that a signal derived from the capacitor microphone meets at least one predetermined criterion. In response to detecting the signal meeting the at least one predetermined criterion, a bias voltage applied to the capacitor microphone may be automatically changed. The at least one of the at least one predetermined criterion may involve magnitude of the signal derived from the capacitor microphone. The capacitor microphone may include a first node and a second node. The bias voltage may be applied to the second node of the capacitor microphone. A voltage change may result from automatically changing the bias voltage applied to the second node of the capacitor microphone. The voltage change may be automatically compensated for.

Yet another embodiment of the present invention provides a microphone system that includes a MEMS microphone and a bias generator coupled to the MEMS microphone. The bias generator may be configured to receive a control signal and apply a bias voltage to the MEMS microphone. The bias generator may be further configured to change the bias voltage applied to the MEMS microphone, based on the control signal.

An embodiment of the present invention provides a microphone system that includes a MEMS microphone and a bias generator coupled to the MEMS microphone. The bias generator may be configured to apply a bias voltage to the MEMS microphone. A control circuit may be configured to process a signal derived from the MEMS microphone. The control circuit may be coupled to the bias generator and configured to automatically control the bias generator so as to adjust the bias voltage, based on the signal derived from the MEMS microphone.

The bias generator may be a charge pump.

The control may be configured to automatically adjust the bias voltage in response to the signal derived from the MEMS microphone meeting at least one predetermined criterion. The control circuit may be configured to automatically adjust the bias voltage by an amount related to magnitude of the signal derived from the MEMS microphone. The control circuit may be configured to automatically adjust the bias voltage, so as to reduce clipping of the signal derived from the MEMS microphone. The control circuit may be configured to automatically adjust the bias voltage, so as to increase sensitivity of the MEMS microphone.

The control circuit may be configured to maintain the bias voltage substantially constant while magnitude of the signal derived from the MEMS microphone is less than a predetermined value. In addition, the control circuit may be configured to automatically reduce the bias voltage by an amount that depends at least in part on an amount by which the magnitude of the signal derived from the MEMS microphone exceeds the predetermined value.

The control circuit may be configured to maintain the bias voltage substantially constant while magnitude of the signal derived from the capacitor microphone is greater than a predetermined value, and automatically increase the bias voltage by an amount that depends at least in part on an amount by which the magnitude of the signal derived from the capacitor microphone is less than the predetermined value.

The control circuit may be configured to maintain the bias voltage substantially constant while magnitude of the signal derived from the capacitor microphone from the capacitor microphone is between a first predetermined value and a second predetermined value. The bias voltage may be automatically increased by an amount that depends on an amount by which the magnitude of the signal derived from the capacitor microphone is less than the first predetermined value. The bias voltage may be automatically reduced by an amount that depends on an amount by which the magnitude of the signal derived from the capacitor microphone exceeds the second predetermined value.

The MEMS microphone may include a first node and a second node. The bias generator may be coupled to the second node of the MEMS microphone. An input bias circuit may be coupled to the first node of the MEMS microphone. The control circuit may be configured to automatically maintain a substantially fixed steady state potential, relative to a reference node, on the first node of the MEMS microphone, despite adjustments in the bias voltage applied to second node the MEMS microphone.

The input bias circuit may include a switched capacitor resistor or a circuit providing a virtual ground or an amplifier circuit.

An input bias circuit may be coupled to the MEMS microphone. The input bias circuit may have impedance. The control circuit may be coupled to the input bias circuit and configured to automatically control the impedance of the input bias circuit, based at least in part on the signal derived from the capacitor microphone.

An input bias circuit may be coupled to a first node of the MEMS microphone. The input bias circuit may have impedance. The control circuit may be coupled to the input bias circuit and configured to automatically change the impedance of the input bias circuit, such that a voltage at the first node of the MEMS microphone, initially changed as a result of automatically adjusting the bias voltage applied to a second node of the MEMS microphone, returns to a value substantially equal to a voltage at the first node of the MEMS microphone before the bias voltage was adjusted.

The input bias circuit may include at least one switched capacitor resistor.

BRIEF DESCRIPTION OF THE DRAWINGS

The invention will be more fully understood by referring to the following Detailed Description of Specific Embodiments in conjunction with the Drawings, of which.

DETAILED DESCRIPTION OF SPECIFIC EMBODIMENTS

In accordance with embodiments of the present invention, methods and apparatus are disclosed for automatically adjusting sensitivity of a MEMS or other capacitor microphone by automatically dynamically adjusting a bias voltage applied to the capacitor microphone. "Dynamically" here means varying over time, not merely set or fixed, such as when a circuit is fabricated or put into service. Dynamic adjustments respond to, or at least partially compensate for, changes in circumstances, such as unpredictable changes in ambient noise. The sensitivity of the capacitor microphone may be automatically dynamically increased or decreased as need, such as in response to variations in the amplitude of a signal derived from the capacitor microphone. Thus, for example, under high ambient noise conditions, the sensitivity may be reduced to avoid clipping or distortion. On the other hand, the sensitivity may be automatically increased, such as when the microphone receives a low magnitude acoustic signal under low ambient sound conditions.

Figure 1:
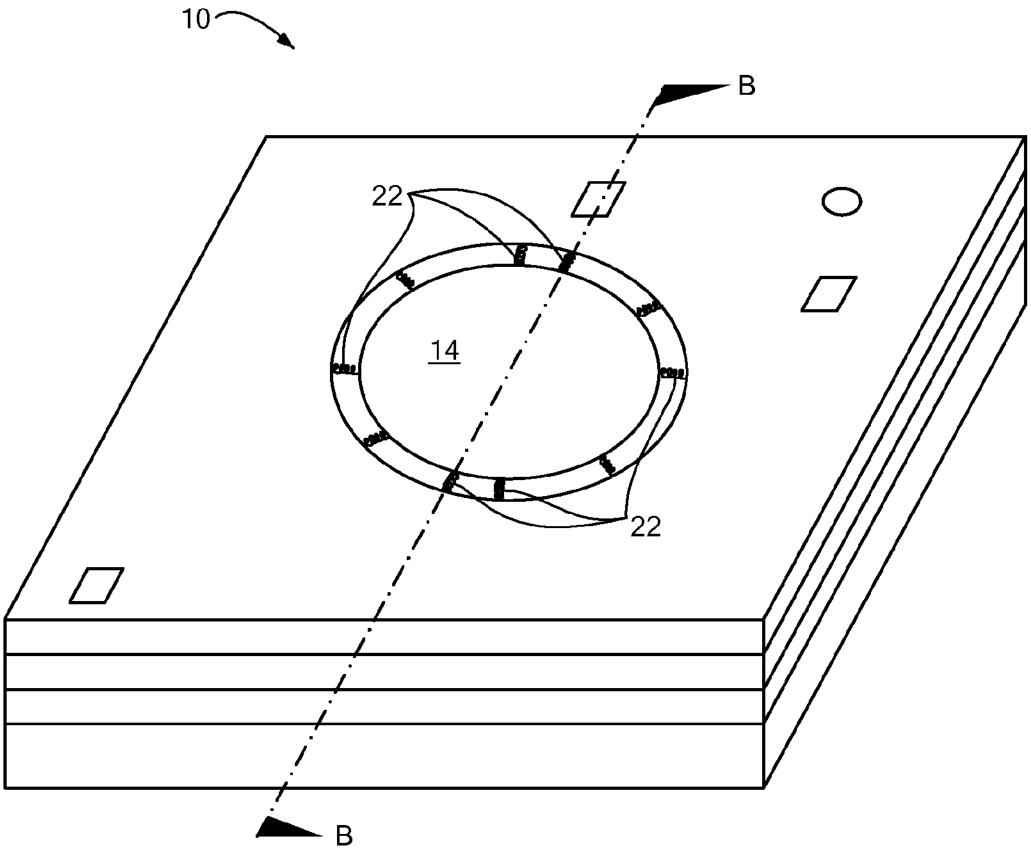
FIG. 1 is a schematic perspective view of a MEMS microphone, according to an embodiment of the present invention.
Figure 2:
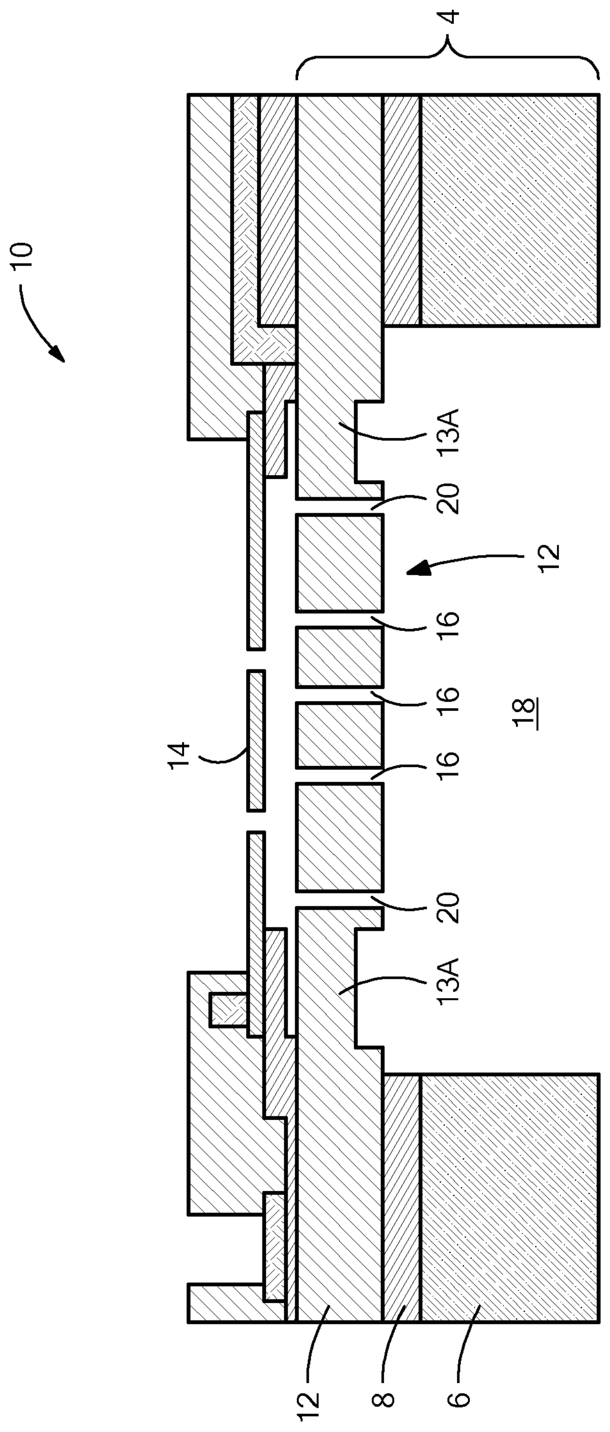
FIG. 2 is a schematic cross-sectional view of the MEMS microphone of FIG. 1.

FIG. 1 schematically shows a perspective view of an unpackaged micro electromechanical system (MEMS) microphone 10 (also referred to as a "microphone chip") according to illustrative embodiments of the invention. FIG. 2 schematically shows a cross-sectional view of the microphone 10 of FIG. 1 across line B-B. These figures are discussed to explain some exemplary components that may make up a microphone, in accordance with various embodiments.

As shown in FIG. 2, the microphone chip 10 has a chip base/substrate 4, one portion of which supports a suspended back plate 12. The microphone 10 also includes a flexible diaphragm 14 that is movable, relative to the back plate 12. The back plate 12 and diaphragm 14 together form a variable capacitor. In illustrative embodiments, the back plate 12 is formed from single crystal silicon (e.g., a part of a silicon-on-insulator (SOI) wafer), while the diaphragm 14 is formed from deposited polysilicon. In other embodiments, however, the back plate 12 and diaphragm 14 may be formed from different materials.

In the embodiment shown in FIG. 2, the substrate 4 includes the back plate 12 and other structures, such as a bottom wafer 6 and buried oxide layer 8 of an SOI wafer. A portion of the substrate 4 also forms a backside cavity 18 extending from the bottom of the substrate 4 to the bottom of the back plate 12. To facilitate operation, the back plate 12 may have a plurality of through-holes 16 that lead to the backside cavity 18.

It should be noted that various embodiments are sometimes described herein using words of orientation, such as "top," "bottom" or "side." These and similar terms are merely employed for convenience and typically refer to the perspective of the drawings. For example, the substrate 4 is below the diaphragm 14, from the perspective shown in FIG. 2. However, the substrate 4 may be in some other orientation, relative to the diaphragm 14, depending on the orientation of the MEMS microphone 10. Thus, in the present discussion, perspective is based on the orientation of the drawings of the MEMS microphone 10.

In operation, acoustic signals strike the diaphragm 14, causing it to vibrate, thus varying the distance between the diaphragm 14 and the back plate 12 and producing a changing capacitance therebetween. Such acoustic signals may contact the microphone 10 from any direction. For example, the acoustic signals may travel upward, first through the back plate 12, and then partially through and against the diaphragm 14. In other embodiments, the audio signals may travel in the opposite direction.

Conventional on-chip or off-chip circuitry (not shown) converts the changing capacitance into electrical signals that can be further processed. This circuitry may be secured within the same package as the microphone 10, to the same substrate 4, or within another package. It should be noted that discussion of the specific microphone 10 shown in FIGS. 1 and 2 is for illustrative purposes only. Other microphone configurations thus may be used with illustrative embodiments of the invention.

A microphone's "sensitivity" refers to a transfer characteristic of the microphone, i.e., a relationship between the voltage or current of a signal produced by the microphone in response to receiving an acoustic signal and the amount of acoustic energy, typically expressed as sound pressure level (SPL), received by the microphone. Conventional microphones have fixed sensitivities, which depend on a variety of factors, primarily the directionality of the microphone and the transducer principle (ex., carbon, dynamic, piezoelectric, capacitor, electret, fiber optic, etc.) used to vary the output signal in relation to the received acoustic signal. The sensitivity of a MEMS or other capacitor microphone depends on the DC voltage applied across the capacitor (formed by the diaphragm and fixed plate) of the microphone. (Some electret microphones have fixed DC potentials, thus their sensitivities can not be changed.)

Figure 3:
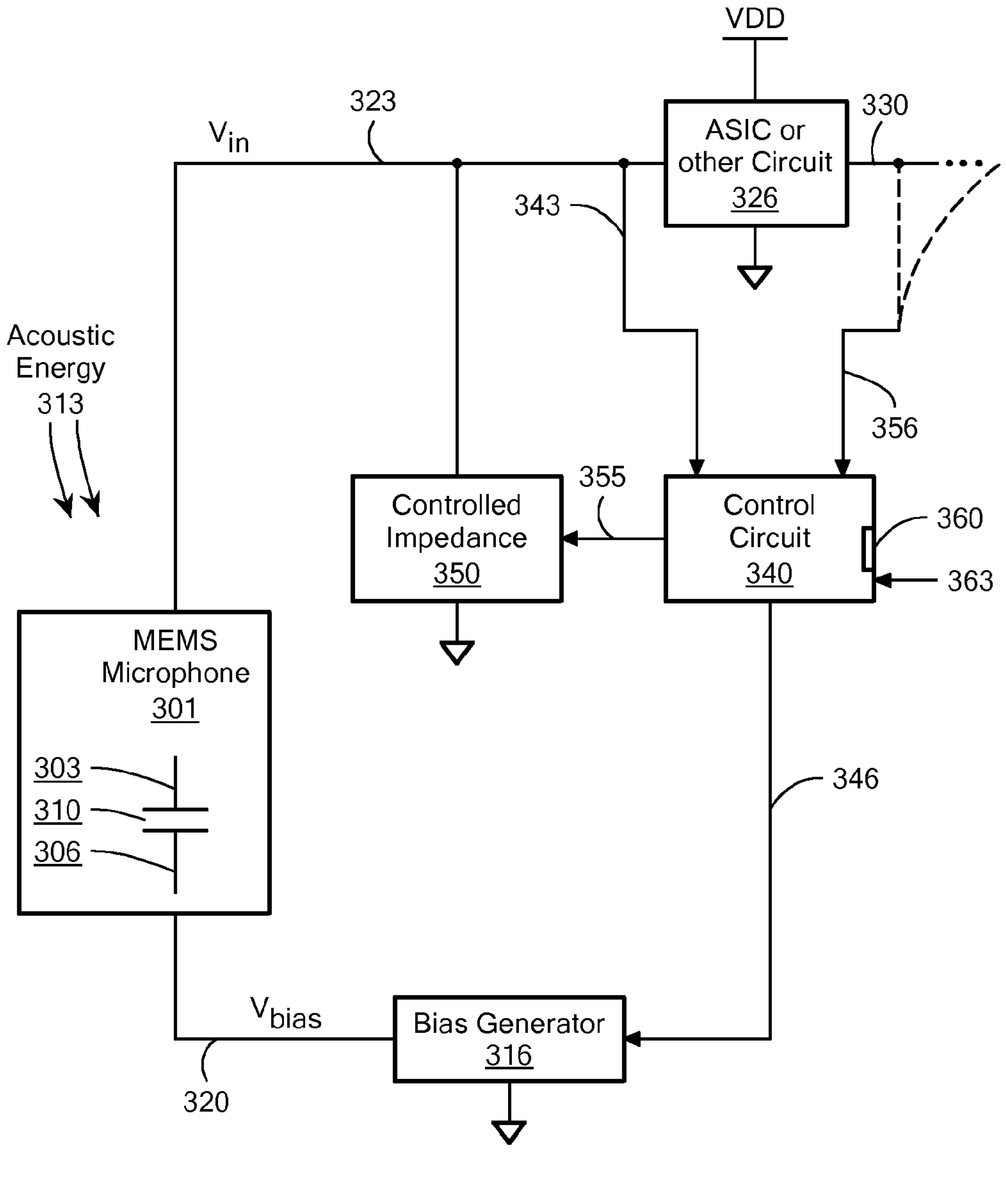
FIG. 3 is a schematic diagram of a circuit for automatically adjusting a bias voltage applied to a capacitor microphone, according to an embodiment of the present invention.

FIG. 3 is a schematic circuit diagram of a MEMS or other capacitor microphone system that automatically dynamically adjusts a bias voltage applied to a MEMS or other capacitor microphone 301. For simplicity of explanation, the microphone is referred to as a MEMS microphone, although other capacitor microphones may be used. The MEMS microphone 301 includes a conductive micromachined diaphragm 303 parallel to, and separated from, a fixed conductive plate 306 that collectively form a capacitor 310. Acoustic energy 313, such as from a user speaking into the MEMS microphone 301, causes the diaphragm 303 to vibrate, which causes the capacitance of the capacitor 310 to vary. A bias generator 316, such as a charge pump or other suitable circuit, applies a bias voltage $V_{bias}$ 320 to the capacitor 310. To facilitate placing the bias voltage across the capacitor 310, the signal side 303 of the capacitor 310 is connected to ground via a controlled impedance path 350.

Herein, "controlled impedance" means an impedance that is known or can be predicted within a relatively narrowly specified range, such as +/− about 30%. The impedance may be fixed or adjustable. Components are selected or manufactured in a way so as to ensure the impedance is within the specified range. For example, if the controlled impedance 350 is fixed, and it is implemented as part of an integrated circuit, the manufacturing process for the integrated circuit may be controlled so as to yield impedances within the specified range. In some embodiments, laser trimming may be used. In some embodiments, the controlled impedance path 350 is adjustable. Such an adjustable impedance may be implemented as a switched capacitor resistor on a silicon or other type of semiconductor substrate. In these cases, the capacitors are fabricated such that impedance values that may be achieved with a switched capacitor resistor circuit are within specified ranges.

These and other available fabrication techniques yield impedances that are more controlled than, for example, anti-parallel diodes used in conventional MEMS microphone systems. The impedances of such diodes in conventional MEMS microphone system are known or predictable within ranges that are larger than the ranges of the controlled impedances described herein. In other words, the impedances of such diodes are not known as precisely as for controlled impedances. Consequently, the amount of time it would take to partially discharge a MEMS or other capacitor microphone through the anti-parallel diodes can not be accurately predicted. "Uncontrolled impedance" herein means impedance that is not known and that can not be predicted within the relatively narrowly specified range.

In the steady state, charge (q) on the capacitor 310 remains essentially constant as the diaphragm vibrates, and the capacitance (C) of the capacitor 110 varies with the vibrations. Thus, a voltage (V) across the capacitor 110 varies according to equation (1).

$$V=q/C \qquad (1)$$

Figure 4:
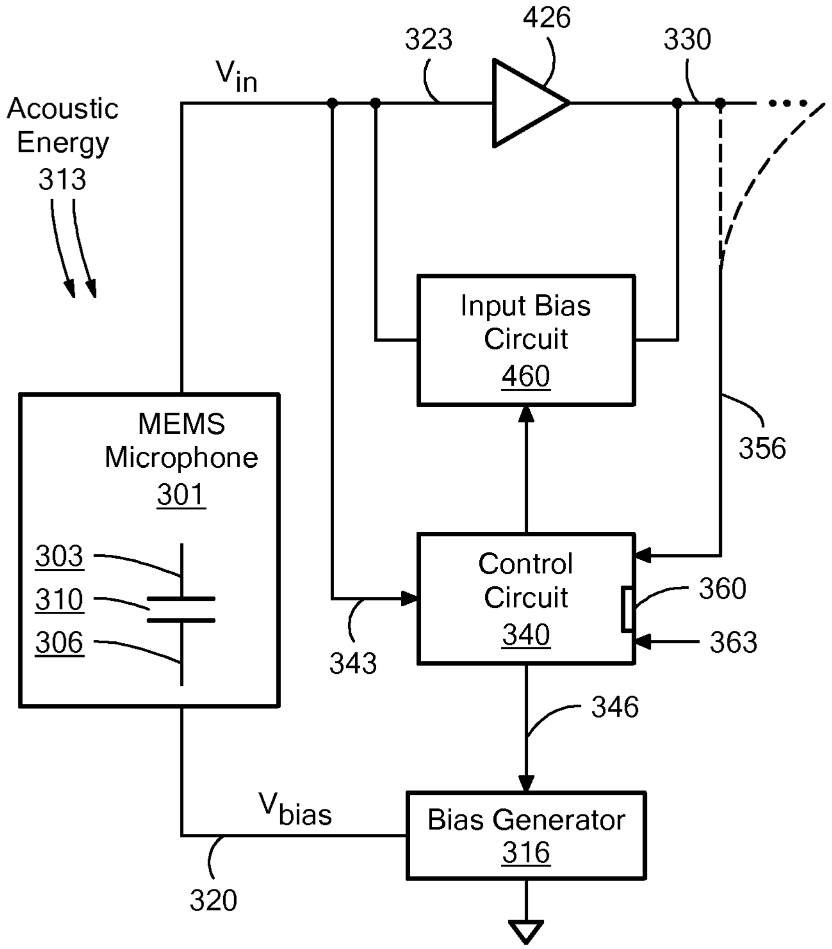
FIG. 4 is a schematic diagram of a circuit for automatically adjusting a bias voltage applied to a capacitor microphone, according to another embodiment of the present invention.

The varying voltage across the capacitor 110 provides a signal $V_{in}$ 323 that may be processed by an ASIC or other circuit 326, such as an amplifier, a buffer or an analog-to-digital converter (for simplicity of explanation, collectively referred to herein as an ASIC). The ASIC 326 generates an output signal 330 that may be used to drive subsequent circuits (not shown). The controlled impedance 350 effectively controls bias of the input to the ASIC 326; thus the controlled impedance 350 is also referred to herein as an "input bias circuit." FIG. 4 is a schematic circuit diagram of an alternative embodiment, in which the input bias circuit 460 bridges a buffer/follower 426. However, in other respects, the embodiment of FIG. 4 is similar to the embodiment of FIG. 3. In both FIGS. 3 and 4, the impedance of the controlled impedance 350 and the input bias circuit 460 may be varied and controlled by the control circuit 340, or the controlled impedance 350 and the input bias circuit 460 may have fixed impedances.

As noted, the MEMS microphone 301 may be subjected to high ambient sounds or low acoustic signals, resulting in distortion of the signal $V_{in}$ 323 (FIG. 3) or a low signal-to-noise ratio. Even if the diaphragm 303 does not reach its absolute displacement limit, the ASIC 326 or other processing circuitry may not be able to handle the peaks of the electrical signal from the MEMS microphone 301, and the signal may be clipped by the ASIC 326 or another circuit, particularly if a sensitive MEMS microphone is used or if the supply voltage VDD to the ASIC 326 is low.

A control circuit 340 is coupled via a line 343 to receive the signal $V_{in}$ 323 produced by the MEMS microphone 301 or another signal 356 generated by the ASIC 326 or another circuit (not shown) downstream of the ASIC 326. The signal $V_{in}$ 323 produced by the MEMS microphone 301 and/or the other signal 356 are referred to herein as a "signal derived from the capacitor microphone." The signal derived from the capacitor microphone 323 or 356 may be an analog signal or a digital signal, such as an output from an analog-to-digital converter (ADC). The signal derived from the capacitor microphone 323 or 356 may be generated within the same package as the MEMS microphone 301 or outside the package. The signal derived from the capacitor microphone 323 or 356 may be generated by a user circuit (not shown), to which the MEMS microphone 301 is directly or indirectly connected.

The control circuit 340 analyzes the signal derived from the capacitor microphone 323 and/or 356 to determine if the signal 323 or 356 meets a criterion, such as whether the signal 323 or 356 is being clipped, clipping of the signal 323 or 356 is imminent or likely, a peak or time average of the amplitude of the signal 323 or 356 is above or below a predetermined level, a signal-to-noise ratio related to the signal 323 or 356 is below a predetermined level or any other suitable criterion or combination of criteria. Optionally or alternatively, other another well-known criterion or criteria used in automatic level control (ALC) circuits and automatic gain control (AGC) circuits may be used. If the control circuit 340 determines that the criterion is met, the control circuit 340 generates a control signal 346 to cause the bias generator 316 to change the bias voltage $V_{bias}$ 320 applied to the capacitor 310.

For example, if the average amplitude of the signal derived from the capacitor microphone is too high, or this signal is expected or likely to become too high, the control circuit 340 causes the bias generator 316 to reduce the bias voltage $V_{bias}$ 320, thereby reducing the sensitivity of the MEMS microphone 301. On the other hand, if the amplitude of the signal derived from the capacitor microphone is too low, the control circuit 340 causes the bias generator 316 to increase the bias voltage $V_{bias}$ 320, thereby increasing the sensitivity of the MEMS microphone 301. The amount by which the bias voltage $V_{bias}$ 320 is adjusted may depend at least in part on an amount by which the signal derived from the capacitor microphone differs from a predetermined value associated with the criterion. The criterion may involve a range of values. For example, the criterion may be met if the amplitude of the signal derived from the capacitor microphone is within a predetermined range of values. On the other hand, the criterion may be met if the signal derived from the capacitor microphone falls outside a predetermined range.

After adjusting the bias voltage $V_{bias}$ 320, if the signal derived from the capacitor microphone 323 or 356 continues to meet the criterion, the control circuit 340 may further decrease or increase the bias voltage $V_{bias}$ 320, as the case may be, thereby further decreasing or increasing (as appropriate) the sensitivity of the MEMS microphone 301. On the other hand, if the signal derived from the capacitor microphone 323 or 356 subsequently ceases to meet the criterion, the control circuit 340 may alter the control signal 346 to cause the bias generator 316 to increase or decrease the bias voltage $V_{bias}$ 320, as appropriate, thereby reversing one or more of the earlier changes made to the bias voltage $V_{bias}$ 320. Thus, the control signal 346 may change as the magnitude of the signal derived from the capacitor microphone 323 or 356 increases or decreases. ("Magnitude" herein means a characteristic of a signal that can be measured and that is desired to be maintained within some limit. For example, magnitude may be a function of amplitude, such a time average of the amplitude.) Consequently, the bias voltage $V_{bias}$ 320 is dynamically adjusted, thereby dynamically adjusting the sensitivity of the MEMS microphone, in response to then-current conditions of the acoustic signal 313 or the signal derived from the capacitor microphone.

The control circuit 340 may be autonomous, in that it contains circuits, data, etc. necessary to perform the functions described herein. Optionally or alternatively, the control circuit 340 may be programmable. That is, the control circuit 340 may accept instructions and/or data via an input port 360. The instructions and/or data may be used to establish one or more aspects of the criterion or criteria used by the control circuit 340. For example, high and low threshold amplitudes may be programmable within the control circuit 340. Similarly, a frequency at which the signal derived from the capacitor microphone is analyzed may be programmable. Optionally or additionally, parameters for the adjustments in the bias voltage $V_{bias}$ 320, such as steps by which the bias voltage $V_{bias}$ 320 is increased or decreased, may be programmable.

In some embodiments, instead of monitoring the signal derived from the capacitor microphone, the control circuit 340 responds to commands from an external circuit. In such embodiments, the lines 343 and 356 may be omitted. Instead, a signal 363 from the external circuit may instruct the control circuit 340 to increase or decrease the sensitivity of the MEMS microphone 301 and, optionally, an amount by which to change the sensitivity. The external circuit may monitor the signal derived from the capacitor microphone and automatically generate the signal 363. Optionally or alternatively, the external circuit may use another criterion to determine whether the sensitivity of the MEMS microphone 301 should be changed and, optionally, by how much.

The external circuit may be controlled by a human user. For example, a human user of a mobile telephone may activate a switch or adjust a dial or another user-operable control to increase or decrease the sensitivity of the MEMS microphone 301.

The controlled impedance 350, the control circuit 340, and/or the bias generator 316 may be implemented as part of the ASIC or other circuit 326. Optionally or alternatively, any of the controlled impedance 350, the control circuit 340, and/or the bias generator 316 may be implemented as part or all of another die packaged with the ASIC 326 or the MEMS microphone 301 or in another package or on a circuit board.

Figure 5:
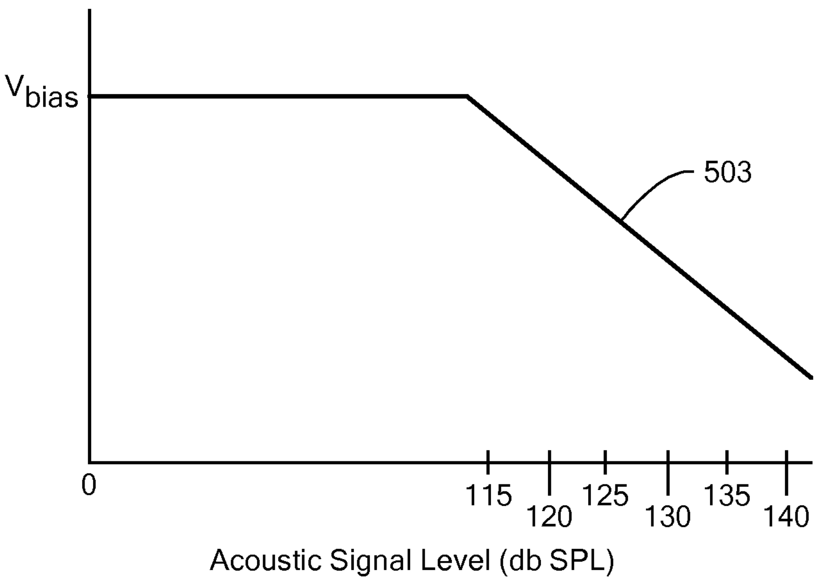
FIGS. 5-7 and 7A are graphs illustrating representative graphs of bias voltages generated by embodiments of the present invention.

FIGS. 5, 6, 7 and 7A illustrate representative graphs of bias voltages $V_{bias}$ generated by embodiments of the control circuit 340 (FIGS. 3 and 4), plotted against the signal derived from the capacitor microphone. For example, the bias voltage $V_{bias}$ may be plotted against an acoustic signal level. In FIG. 5, the bias voltage $V_{bias}$ 320 (FIGS. 3 and 4) is held relatively constant while the acoustic signal level is below a predetermined value, such as about 115 db SPL. However, at acoustic signal levels greater than the predetermined acoustic signal level, the bias voltage $V_{bias}$ 320 (FIGS. 3 and 4) is progressively reduced, so as to decrease the sensitivity of the MEMS microphone 301. Although the portion 503 of the graph shown in FIG. 5 (and corresponding portions of FIGS. 6 and 7) is straight, this and/or other portions of the graph may be curved, piece-wise linear or other shapes.

Figure 6:
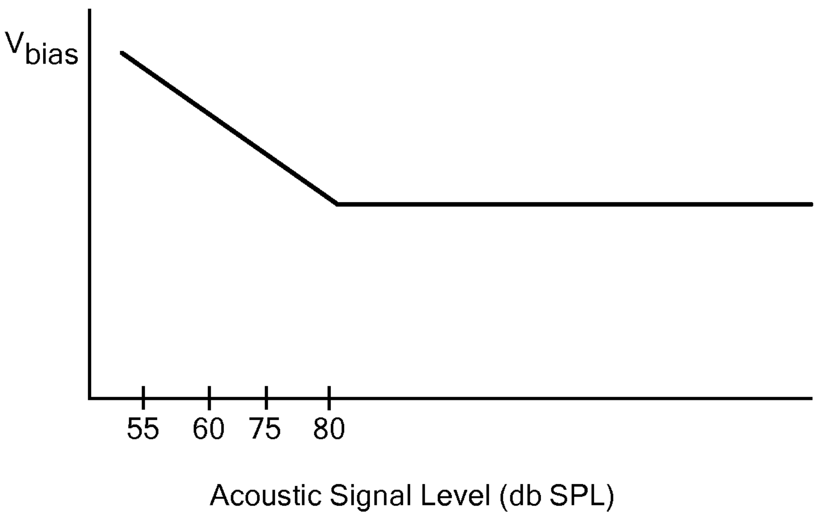

In FIG. 6, the bias voltage $V_{bias}$ 320 (FIGS. 3 and 4) is held relatively constant while the acoustic signal level is above a predetermined value, such as about 80 db SPL. However, at acoustic signal levels less than about 80 db SPL, the bias voltage $V_{bias}$ 320 (FIGS. 3 and 4) is progressively increased, so as to increase the sensitivity of the MEMS microphone 301.

Figure 7:
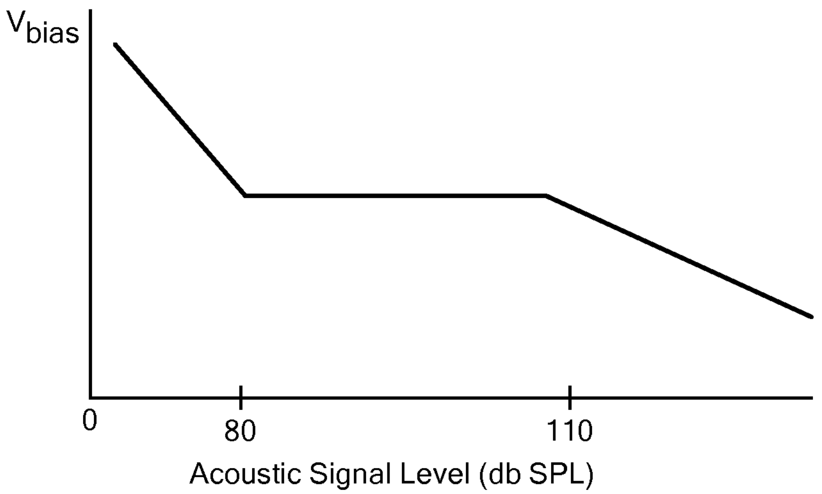

In FIG. 7, the bias voltage $V_{bias}$ 320 (FIGS. 3 and 4) is adjusted for both low and high amplitudes of the signal derived from the capacitor microphone. The bias voltage $V_{bias}$ 320 is held relatively constant while the acoustic signal level is between a first predetermined value, such as about 80 db SPL, and a second predetermined value, such as about 110 db SPL. However, at acoustic signal levels less than the first predetermined value, the bias voltage $V_{bias}$ 320 is progressively increased, so as to increase the sensitivity of the MEMS microphone 301, and at acoustic signal levels greater than the second predetermined acoustic signal level, the bias voltage $V_{bias}$ 320 is progressively reduced, so as to decrease the sensitivity of the MEMS microphone 301.

Figure 7A:
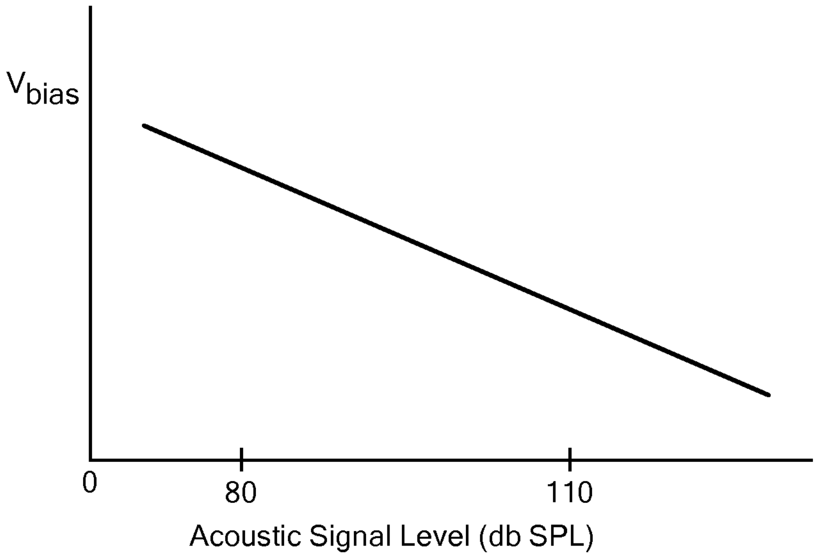

In FIG. 7A, the bias voltage $V_{bias}$ 320 (FIGS. 3 and 4) is adjusted over the entire range of possible amplitudes of the signal derived from the capacitor microphone. The bias voltage $V_{bias}$ 320 is decreased as the acoustic signal level increases, so as to decrease the sensitivity of the MEMS microphone 301 as the acoustic signal level increases.

The values of the acoustic signal levels described above are exemplary. Other values may be used, depending on actual characteristics of the MEMS microphone 301, expected ambient sound levels, expected acoustic signal strengths, desired system characteristics, "headroom" of circuits that process signals from the MEMS microphone 301, etc. As noted, the predetermined values may be fixed within the control circuit 340, or these values may be programmable. Similarly, the amounts by which the bias voltage is changed, in response to the signal derived from the MEMS microphone, may be fixed within the control circuit 340, or these values may be programmable.

Figure 8:
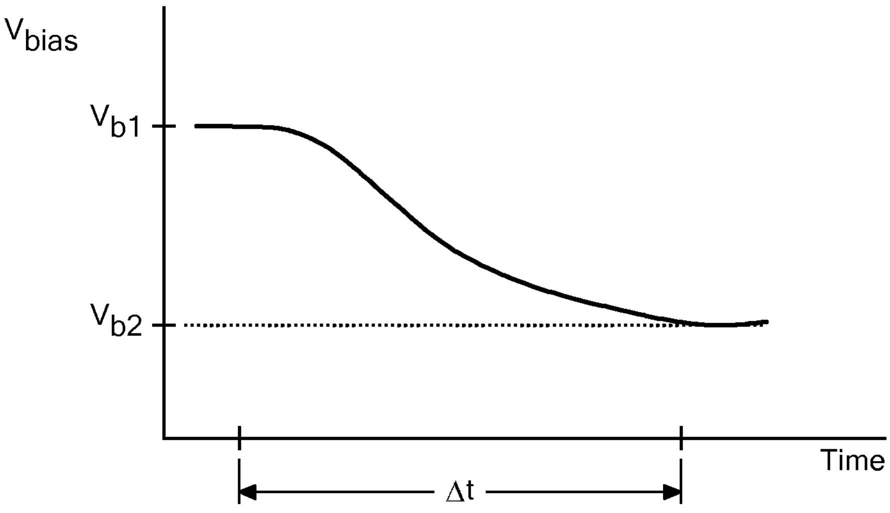
FIG. 8 is a graph illustrating a smooth adjustment of the bias voltage generated by embodiments of the present invention.

To eliminate or reduce audible artifacts associated with changing the bias voltage $V_{bias}$ 320, the bias voltage $V_{bias}$ 320 may be changed gradually, over a period of time Δt, as illustrated in the graph of FIG. 8. In one embodiment, when the bias voltage $V_{bias}$ 320 is changed from a first value $V_{b1}$ to a second value $V_{b2}$, the change is made smoothly over the course of at least about tens of milliseconds. Other time values may be used in other embodiments. The voltage-time profile of the bias voltage $V_{bias}$ 320 may be controlled by the bias generator 316 and/or by the control circuit 340. Parameters of the voltage profile may be fixed within the control circuit 340, or these parameters may be programmable.

Changing the bias voltage $V_{bias}$ 320 applied to the MEMS microphone 301 changes the voltage across the MEMS microphone 301 and temporarily may alter the DC voltage at the signal side 303 of the MEMS microphone (as described below). The capacitor 310 of the MEMS microphone forms a resistor-capacitor (RC) circuit with the impedance 350. Thus, after the bias voltage $V_{bias}$ 320 is changed, the DC component of the signal $V_{in}$ 323 from the MEMS microphone changes ("settles") according to the product of the capacitance of the MEMS microphone 301 and the resistance of the impedance 350. The desired voltage across the capacitor 310 and, therefore, the sensitivity of the MEMS microphone 301, is not achieved until the DC voltage has settled.

In prior art MEMS microphone systems, a fixed uncontrolled impedance is used instead of the controlled impedance 350 shown in FIG. 3. Such a prior art high uncontrolled impedance would contribute to a relatively long and unpredictable settling time. In the prior art, any high impedance that yields a sub-audible (i.e., below about 20 Hz) high-pass filter corner of the RC circuit is considered sufficient. Thus, prior art circuits were not designed with controlled impedance.

To achieve a relatively short settling time, embodiments of the present invention use a controlled impedance 350 that is fixed and low enough for the DC voltage at the signal side 303 of the MEMS microphone to settle within a desired relatively short period of time, or the controlled impedance 350 is selectively temporarily reduced to drain charge from the MEMS microphone capacitor. For example, assuming the capacitance of the MEMS microphone is about 1 pF, to achieve a settling time of about a few milliseconds to about a few tens of milliseconds, the resistance of the controlled impedance 350 may be reduced to a value of about 1-10 Gohms, while the DC voltage settles. That is, the resistance of the controlled impedance 350 may be reduced for about a few milliseconds to about a few tens of milliseconds, and then the resistance may be increased back to its original value. The controlled impedance 350 may be controlled by the control circuit 340 via a control signal 355. Alternatively, the impedance may be set to a fixed value that produces a desired settling characteristic, such as implementing a high-pass corner of or below about 20 Hz, when the impedance works with MEMS capacitor.

The controlled impedance 350 may be implemented with a switched capacitor circuit, with a switched capacitor circuit in parallel with a fixed high-impedance circuit or with any other suitable circuit whose impedance can be controlled.

Figure 9:
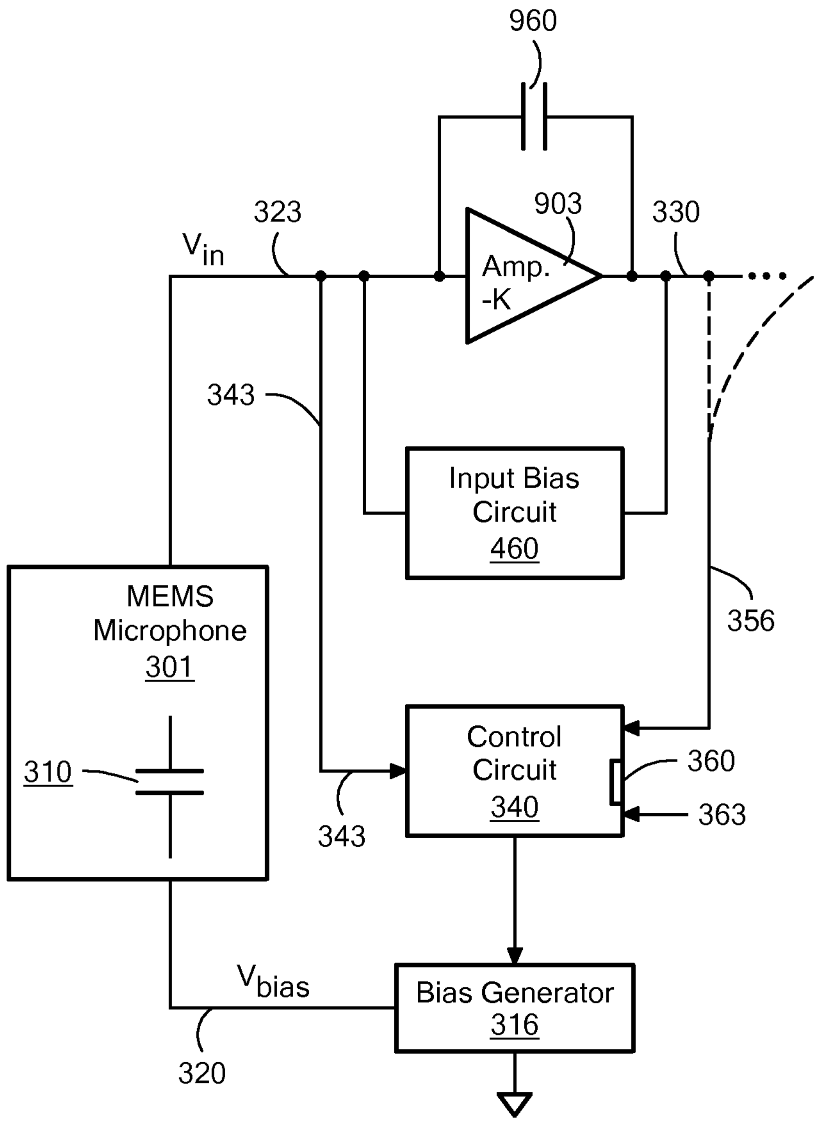
FIGS. 9 and 10 are schematic diagrams of circuits for automatically adjusting a bias voltage applied to a capacitor microphone, according to other embodiments of the present invention.
Figure 10:
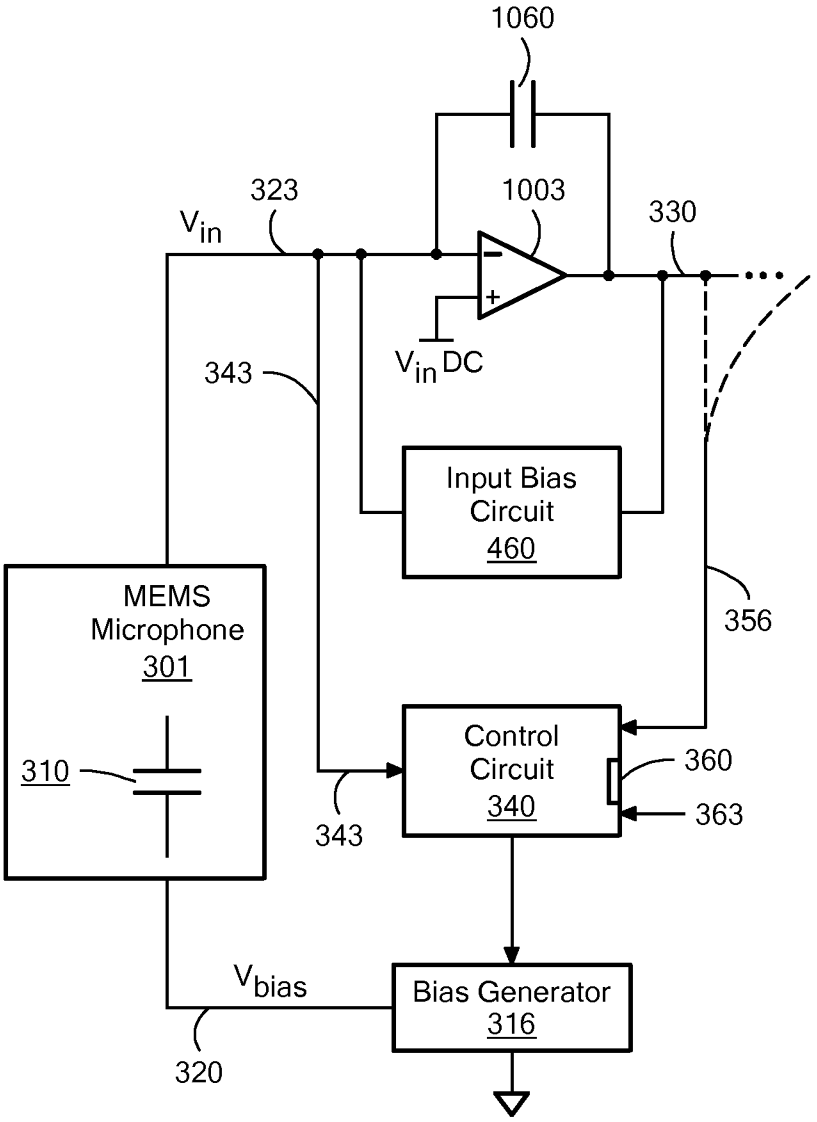

Optionally or alternatively, as shown in the schematic circuit diagrams in FIGS. 9 and 10, a virtual ground circuit may used in the signal side $V_{in}$ 323 of the MEMS microphone 301. In such cases, the node carrying the signal $V_{in}$ is connected to an input of a feedback amplifier 903 or 1003, which forces the $V_{in}$ node to a fixed DC voltage, and the voltage across the capacitor 310 of the MEMS microphone 301 tracks changes in the bias voltage $V_{bias}$ 320. Consequently, DC impedance of the $V_{in}$ node need not be controlled to the extent it is in the embodiment described above, with respect to FIG. 3. However, the input bias generator 460 and the feedback capacitor 960 or 1060 should be selected such that the high-pass filter corner formed by these components occurs at a sub-audible frequency, such as below about 20 Hz. Optionally, the control circuit 340 may adjust the impedance of the input bias circuit 460 (not shown).

Figure 11:
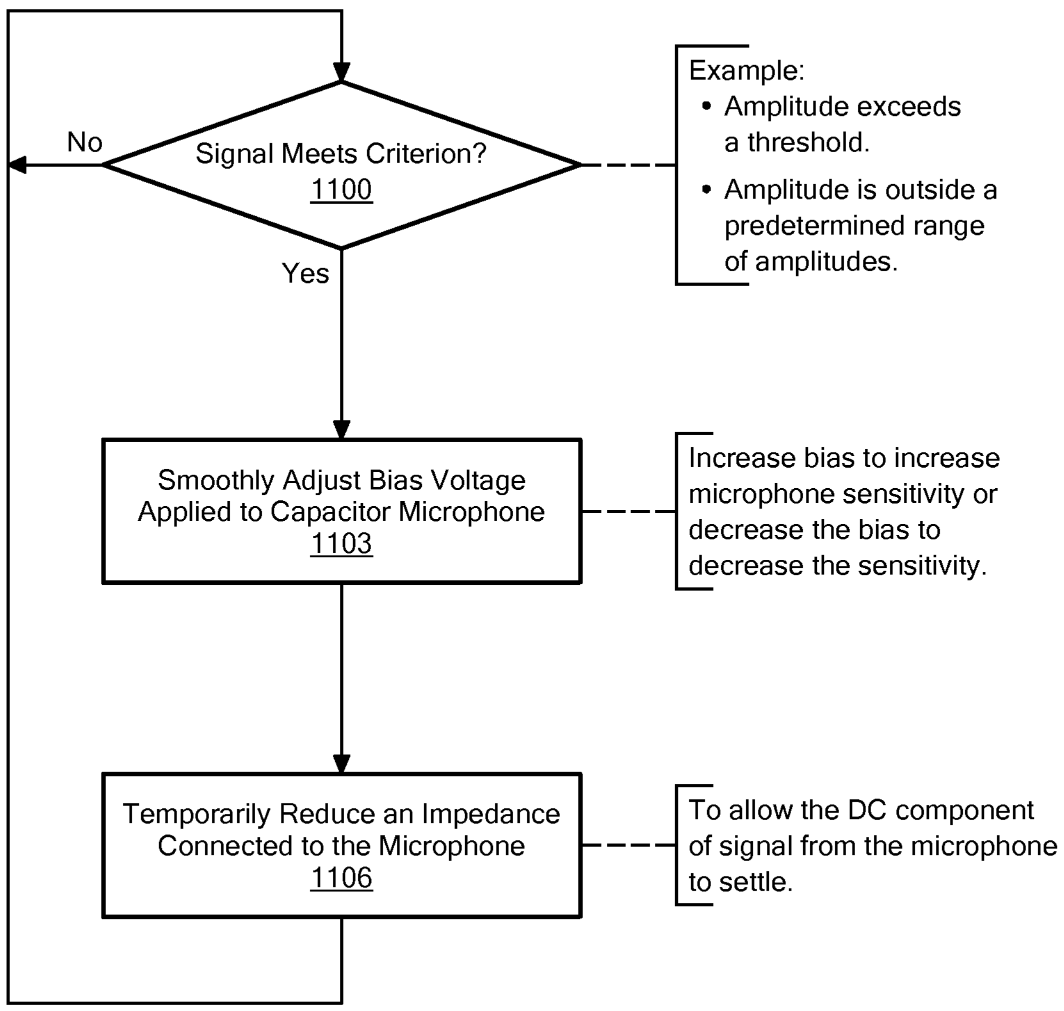
FIG. 11 is a flow diagram illustrating operation of an embodiment of the present invention.

FIG. 11 contains a flow diagram summarizing operation of some embodiments of the present invention. At 1100, a signal from a microphone is analyzed to determine whether the signal meets a criterion. As noted, the analyzed signal may come directly from the microphone or from another portion of the circuit. The criterion may involve: whether the amplitude of the signal exceeds a predetermined or a dynamically determined threshold; whether the amplitude of the signal falls below a predetermined or a dynamically determined threshold; whether the amplitude of the signal is within a predetermined range of values; whether the amplitude of the signal is outside a predetermined range of values; or some other criterion or combination of criteria (collectively herein referred to as a "criterion").

Various aspects of a signal may be considered in determining if the signal meets a criterion. For example, instantaneous or average amplitude of the signal may be compared to a fixed or variable threshold value. Optionally or alternatively, the average may be a root mean square (RMS) value, an average of peak amplitudes of the signal envelope or any other suitable function. Criteria used in conventional automatic gain control (AGC) and other well-known systems for determining when and to what extent a signal should be amplified or attenuated, and when and to what extent the amplification or attenuation should be removed, may be used. If the criterion is not met, control returns to 1100, where the signal analysis and criterion determination are performed again. Optionally, a delay (not shown) may be introduced before the analysis of 1100 is repeated.

If the criterion is met, at 1103 signals are generated to adjust a bias voltage applied to the microphone. The amount of adjustment may depend on various factors, such as: the amplitude of the analyzed signal; the rate of change of the amplitude of the analyzed signal; the amount (if any) by which the bias was recently adjusted; the difference between the current amplitude of the analyzed signal and the amplitude at which the signal would be clipped (i.e., the amount of remaining "headroom"); or the length of time since the last change was made to the bias voltage. The bias voltage may, but need not, be adjusted smoothly.

Optionally, the criterion may be adjusted (not shown). For example, once the bias voltage has been adjusted, the criterion may be changed, such that the threshold that must be exceeded to trigger further bias voltage adjustments may be reduced, for example, from about 75% to about 25% of the amplitude at which the onset of clipping would occur.

Once the analyzed signal no longer meets the criterion, the control circuit 340 may return the bias voltage $V_{bias}$ 320 to a previous value using the same or similar logic and/or circuits as described above for adjusting the bias voltage $V_{bias}$ 320. The control circuit 340 may introduce a delay or hysteresis before adjusting the bias voltage $V_{bias}$ 320 to avoid or reduce the likelihood of repeatedly cycling its operation. For example, once the control circuit 340 adjusts the bias voltage $V_{bias}$ 320, the control circuit 340 may change the threshold necessary to meet the criterion. Furthermore, the same or a different criterion may be used to determine when, i.e., in response to what signal attributes, and to what extent to return the bias voltage $V_{bias}$ 320 to a previous value. Thus, the bias voltage $V_{bias}$ 320 may be adjusted in equal or unequal amounts (smoothly or in steps) and in response to the signal meeting symmetric or asymmetric criteria.

Embodiments of the present invention may be used with various types of capacitor microphones, including MEMS microphones, electret condenser microphones (ECMs), etc. The control circuit 340 and/or the bias generator 316 may be implemented with analog circuits or combinatorial logic, by a processor (such as a digital signal processor (DSP)) executing instructions stored in a memory or by any other appropriate circuit or combination. The control circuit 340, the bias generator 316, the controlled impedance circuit 350 and/or the input bias circuit 460 may be included in the same package as the MEMS microphone 301 or in a separate package. If any of these circuits is included in the same package as the MEMS microphone 301, the circuit may be implemented on the same die as the MEMS microphone or on a separate die.

A control circuit has been described as including a processor controlled by instructions stored in a memory. The memory may be random access memory (RAM), read-only memory (ROM), flash memory or any other memory, or combination thereof, suitable for storing control software or other instructions and data. Some of the functions performed by the methods and apparatus for automatically adjusting a bias voltage for a microphone in response to the signal meeting a criterion have been described with reference to flowcharts and/or block diagrams. Those skilled in the art should readily appreciate that functions, operations, decisions, etc. of all or a portion of each block, or a combination of blocks, of the flowcharts or block diagrams may be implemented as computer program instructions, software, hardware, firmware or combinations thereof. Those skilled in the art should also readily appreciate that instructions or programs defining the functions of an embodiment of the present invention may be delivered to a processor in many forms, including, but not limited to, information permanently stored on non-writable storage media (e.g. read-only memory devices within a computer, such as ROM, or devices readable by a computer I/O attachment, such as CD-ROM or DVD disks), information alterably stored on writable storage media (e.g. floppy disks, removable flash memory and hard drives) or information conveyed to a computer through communication media, including wired or wireless computer networks. In addition, while the invention may be embodied in software, the functions necessary to implement the invention may optionally or alternatively be embodied in part or in whole using firmware and/or hardware components, such as combinatorial logic, Application Specific Integrated Circuits (ASICs), Field-Programmable Gate Arrays (FPGAs) or other hardware or some combination of hardware, software and/or firmware components.

While the invention is described through the above-described exemplary embodiments, it will be understood by those of ordinary skill in the art that modifications to, and variations of, the illustrated embodiments may be made without departing from the inventive concepts disclosed herein. For example, although some aspects of methods and apparatus have been described with reference to a flowchart, those skilled in the art should readily appreciate that functions, operations, decisions, etc. of all or a portion of each block, or a combination of blocks, of the flowchart may be combined, separated into separate operations or performed in other orders. Furthermore, disclosed aspects, or portions of these aspects, may be combined in ways not listed above. Accordingly, the invention should not be viewed as being limited to the disclosed embodiment(s).

What is claimed is:

1. A method for adjusting sensitivity of a capacitor microphone, the method comprising:

whenever sufficient power is provided to the capacitor microphone, repeatedly dynamically changing a bias voltage applied to the capacitor microphone, based at least in part on a signal derived from the capacitor microphone and independent of any stored bias voltage values and any stored digital representations of the bias voltage values.

2. A method according to claim 1, further comprising:

accepting a control signal;

wherein dynamically changing the bias voltage comprises dynamically changing the bias voltage based at least in part on the control signal.

3. A method according to claim 1, wherein automatically changing the bias voltage comprises automatically changing the bias voltage so as to maintain magnitude of a signal from the capacitor microphone within a predetermined range.

4. A method according to claim 1, wherein automatically changing the bias voltage comprises automatically changing the bias voltage so as to reduce clipping of the signal derived from the capacitor microphone.

5. A method according to claim 1, wherein automatically changing the bias voltage comprises automatically changing the bias voltage so as to increase sensitivity of the capacitor microphone in response to the capacitor microphone receiving a low magnitude acoustic signal.

6. A method according to claim 1, further comprising returning the bias voltage to a previous value.

7. A method according to claim 1, wherein dynamically changing the bias voltage comprises dynamically changing the bias voltage in response to the signal derived from the capacitor microphone meeting at least one predetermined criterion.

8. A method according to claim 7, wherein at least one of the at least one predetermined criterion involves magnitude of the signal derived from the capacitor microphone.

9. A method according to claim 1, wherein automatically changing the bias voltage comprises:

maintaining the bias voltage substantially constant while magnitude of the signal derived from the capacitor microphone is less than a predetermined value; and automatically reducing the bias voltage by an amount that depends at least in part on an amount by which the magnitude of the signal derived from the capacitor microphone exceeds the predetermined value.

10. A method according to claim 1, wherein automatically changing the bias voltage comprises:

maintaining the bias voltage substantially constant while magnitude of the signal derived from the capacitor microphone is within a predetermined range; and automatically reducing the bias voltage by an amount that depends at least in part on an amount by which the magnitude of the signal derived from the capacitor microphone differs from a value within the predetermined range.

11. A method according to claim 1, wherein automatically changing the bias voltage comprises:

maintaining the bias voltage substantially constant while magnitude of the signal derived from the capacitor microphone is greater than a predetermined value; and automatically increasing the bias voltage by an amount that depends at least in part on an amount by which the magnitude of the signal derived from the capacitor microphone is less than the predetermined value.

12. A method according to claim 1, wherein dynamically changing the bias voltage comprises:

maintaining the bias voltage substantially constant while magnitude of the signal derived from the capacitor microphone is between a first predetermined value and a second predetermined value;

automatically increasing the bias voltage by an amount that depends at least in part on an amount by which the magnitude of the signal derived from the capacitor microphone is less than the first predetermined value; and automatically reducing the bias voltage by an amount that depends at least in part on an amount by which the magnitude of the signal derived from the capacitor microphone exceeds the second predetermined value.

13. A method according to claim 12, wherein automatically reducing the bias voltage comprises automatically reducing the bias voltage such that the bias voltage is changed by the amount over a time period of at least about ten milliseconds.

14. A method according to claim 13, wherein automatically reducing the bias voltage comprises automatically reducing the bias voltage such that the bias voltage is changed by the amount over a time period of at least about one milliseconds.

15. A method according to claim 1, further comprising automatically compensating for a voltage change at a first node of the capacitor microphone, the voltage change being a result of changing the bias voltage applied to a second node, different than the first node, of the capacitor microphone.

16. A method according to claim 15, wherein automatically compensating for the voltage change comprises providing a virtual ground coupled to the first node of the capacitor microphone.

17. A method according to claim 1, wherein:

the capacitor microphone includes a first node and a second node; and the bias voltage is applied to the second node of the capacitor microphone; the method further comprising:

automatically changing impedance of a circuit coupled to the first node in timed relation to automatically changing the bias voltage.

18. A method according to claim 17, wherein automatically changing the impedance of the circuit comprises:

automatically reducing the impedance of the circuit in timed relation to changing the bias voltage; and then automatically increasing the impedance of the circuit.

19. A method according to claim 18, wherein automatically changing the impedance of the circuit comprises automatically reducing the impedance of the circuit and then automatically increasing the impedance of the circuit, such that a voltage at the first node of the capacitor microphone, initially changed as a result of automatically changing the bias voltage applied to the second node of the capacitor microphone, returns to a value substantially equal to a voltage at the first node of the capacitor microphone before the bias voltage was changed.

20. A method according to claim 19, wherein automatically changing the impedance of the circuit comprises automatically reducing the impedance of the circuit and then automatically increasing the impedance of the circuit, such that the voltage at the first node of the capacitor microphone returns within about 50 milliseconds to the value substantially equal to the voltage at the first node of the capacitor microphone before the bias voltage was changed.

21. A method according to claim 20, wherein automatically changing the impedance of the circuit comprises automatically reducing the impedance of the circuit and then automatically increasing the impedance of the circuit, such that the voltage at the first node of the capacitor microphone returns within about one second to the value substantially equal to the voltage at the first node of the capacitor microphone before the bias voltage was changed.

22. A method according to claim 1, further comprising automatically changing an impedance of a circuit coupled to a first node of the capacitor microphone, such that a voltage at the first node of the capacitor microphone, initially changed as a result of automatically changing the bias voltage applied to a second node of the capacitor microphone, returns to a value substantially equal to a voltage at the first node of the capacitor microphone before the bias voltage was changed.

23. A method according to claim 22, wherein automatically changing the impedance of the circuit comprises automatically reducing the impedance of the circuit and then automatically increasing the impedance of the circuit.

24. A method according to claim 1, further comprising automatically maintaining a substantially constant steady state voltage at a first node of the capacitor microphone, despite automatically changing the bias voltage applied to a second node of the capacitor microphone.

25. A method according to claim 24, wherein automatically maintaining the substantially constant steady state voltage at the first node of the capacitor microphone comprises coupling the first node to a virtual ground.

26. A method according to claim 24, wherein automatically maintaining the substantially constant steady state voltage at the first node of the capacitor microphone comprises coupling the first node to an input of an amplifier.

27. A method for automatically adjusting sensitivity of a capacitor microphone, the method comprising:

automatically detecting that a signal derived from the capacitor microphone meets at least one predetermined criterion;

in response to detecting the signal meets the at least one predetermined criterion, automatically changing a bias voltage applied to the capacitor microphone, based at least in part on a signal derived from the capacitor microphone and independent of any stored bias voltage values and any stored digital representations of the bias voltage values; and whenever sufficient power is provided to the capacitor microphone, repeatedly performing the detecting and the changing.

28. A method according to claim 27, wherein at least one of the at least one predetermined criterion involves magnitude of the signal derived from the capacitor microphone.

29. A method according to claim 27, wherein:

the capacitor microphone includes a first node and a second node; and the bias voltage is applied to the second node of the capacitor microphone; the method further comprising:

automatically compensating for a voltage change at the first node of the capacitor microphone, the voltage change being a result of automatically changing the bias voltage applied to the second node of the capacitor microphone.

30. A microphone system, comprising:

a MEMS microphone; and a bias generator coupled to the MEMS microphone and configured, whenever sufficient power is provided to the capacitor microphone, to repeatedly: receive a control signal; apply a bias voltage to the MEMS microphone; and change the bias voltage applied to the MEMS microphone, based on the control signal, wherein the bias voltage is independent of any stored bias voltage and any stored digital representations of the bias voltage.

31. A microphone system, comprising:

a MEMS microphone;

a bias generator coupled to the MEMS microphone and configured to apply a bias voltage to the MEMS microphone; and a control circuit coupled to the bias generator and configured to repeatedly, whenever sufficient power is provided to the capacitor microphone: process a signal derived from the MEMS microphone and automatically control the bias generator so as to adjust the bias voltage, based on the signal derived from the MEMS microphone, wherein the bias voltage is independent of any stored bias voltage and any stored digital representations of the bias voltage.

32. A microphone system according to claim 31, wherein the bias generator comprises a charge pump.

33. A microphone system according to claim 31, wherein the control circuit is configured to automatically adjust the bias voltage in response to the signal derived from the MEMS microphone meeting at least one predetermined criterion.

34. A microphone system according to claim 31, wherein the control circuit is configured to automatically adjust the bias voltage by an amount related to magnitude of the signal derived from the MEMS microphone.

35. A microphone system according to claim 31, wherein the control circuit is configured to automatically adjust the bias voltage, so as to reduce clipping of the signal derived from the MEMS microphone.

36. A microphone system according to claim 31, wherein the control circuit is configured to automatically adjust the bias voltage, so as to increase sensitivity of the MEMS microphone.

37. A microphone system according to claim 31, wherein the control circuit is configured to:

maintain the bias voltage substantially constant while magnitude of the signal derived from the MEMS microphone is less than a predetermined value; and automatically reduce the bias voltage by an amount that depends at least in part on an amount by which the magnitude of the signal derived from the MEMS microphone exceeds the predetermined value.

38. A microphone system according to claim 31, wherein the control circuit is configured to:

maintain the bias voltage substantially constant while magnitude of the signal derived from the capacitor microphone is greater than a predetermined value; and automatically increase the bias voltage by an amount that depends at least in part on an amount by which the magnitude of the signal derived from the capacitor microphone is less than the predetermined value.

39. A microphone system according to claim 31, wherein the control circuit is configured to:

maintain the bias voltage substantially constant while magnitude of the signal derived from the capacitor microphone from the capacitor microphone is between a first predetermined value and a second predetermined value;

automatically increase the bias voltage by an amount that depends on an amount by which the magnitude of the signal derived from the capacitor microphone is less than the first predetermined value; and automatically reduce the bias voltage by an amount that depends on an amount by which the magnitude of the signal derived from the capacitor microphone exceeds the second predetermined value.

40. A microphone system according to claim 31, wherein:

the MEMS microphone includes a first node and a second node;

the bias generator is coupled to the second node of the MEMS microphone; and further comprising:

an input bias circuit coupled to the first node of the MEMS microphone; wherein:

the control circuit is configured to automatically maintain a substantially fixed steady state potential, relative to a reference node, on the first node of the MEMS microphone, despite adjustments in the bias voltage applied to second node the MEMS microphone.

41. A microphone system according to claim 40, wherein the input bias circuit comprises a switched capacitor resistor.

42. A microphone system according to claim 40, wherein the input bias circuit comprises a circuit providing a virtual ground.

43. A microphone system according to claim 40, wherein the input bias circuit comprises an amplifier circuit.

44. A microphone system according to claim 31, further comprising:

an input bias circuit coupled to the MEMS microphone, the input bias circuit having an impedance; and wherein:

the control circuit is coupled to the input bias circuit and configured to automatically control the impedance of the input bias circuit, based at least in part on the signal derived from the capacitor microphone.

45. A microphone system according to claim 31, further comprising:

an input bias circuit coupled to a first node of the MEMS microphone, the input bias circuit having an impedance; and wherein:

the control circuit is coupled to the input bias circuit and configured to automatically change the impedance of the input bias circuit, such that a voltage at the first node of the MEMS microphone, initially changed as a result of automatically adjusting the bias voltage applied to a second node of the MEMS microphone, returns to a value substantially equal to a voltage at the first node of the MEMS microphone before the bias voltage was adjusted.

46. A microphone system according to claim 45, wherein the input bias circuit comprises at least one switched capacitor resistor.

47. A method according to claim 1, wherein determining whether or not a signal derived from the capacitor microphone meets at least one predetermined criterion and based on the signal meeting at least one predetermined criterion, repeatedly dynamically changing a bias voltage applied to the capacitor microphone, wherein the at least one predetermined criterion comprising any combination of: the signal being clipped, clipping of the signal being imminent or likely, a peak or time average of an amplitude of the signal being above or below a predetermined level, and a signal-to-noise ratio related to the signal being below a predetermined level.

48. A method according to claim 27, wherein the at least one predetermined criterion comprising any combination of: the signal being clipped, clipping of the signal being imminent or likely, a peak or time average of an amplitude of the signal being above or below a predetermined level, and a signal-to-noise ratio related to the signal being below a predetermined level.

49. A microphone system according to claim 30, wherein the bias voltage is applied to the MEMS microphone based on at least one predetermined criterion, further wherein the at least one predetermined criterion comprising any combination of: the signal being clipped, clipping of the signal being imminent or likely, a peak or time average of an amplitude of the signal being above or below a predetermined level, and a signal-to-noise ratio related to the signal being below a predetermined level.

50. A microphone system according to claim 31, wherein the bias voltage is applied to the MEMS microphone based on at least one predetermined criterion, further wherein the at least one predetermined criterion comprising any combination of: the signal being clipped, clipping of the signal being imminent or likely, a peak or time average of an amplitude of the signal being above or below a predetermined level, and a signal-to-noise ratio related to the signal being below a predetermined level.

* * * * *